United States Patent
Murakami et al.

(10) Patent No.: US 11,328,953 B2
(45) Date of Patent: May 10, 2022

(54) WIRING CIRCUIT AND METHOD FOR PRODUCING SAME

(71) Applicant: KANEKA CORPORATION, Osaka (JP)

(72) Inventors: Mutsuaki Murakami, Osaka (JP); Yuki Kawashima, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 17/013,055

(22) Filed: Sep. 4, 2020

(65) Prior Publication Data

US 2020/0402850 A1 Dec. 24, 2020

Related U.S. Application Data (63) Continuation of application No. PCT/JP2019/007364, filed on Feb. 26, 2019.

(30) Foreign Application Priority Data

Mar. 9, 2018 (JP) .............................. JP2018-042640

(51) Int. Cl.
  *H01L 21/00* (2006.01)
  *H01L 21/768* (2006.01)
  (Continued)

(52) U.S. Cl.
  CPC .. *H01L 21/76885* (2013.01); *H01L 21/32136* (2013.01); *H01L 23/528* (2013.01); *H01L 23/53276* (2013.01)

(58) Field of Classification Search
  CPC ......... H01L 21/76885; H01L 21/32136; H01L 23/528
  See application file for complete search history.

(56) References Cited

U.S. PATENT DOCUMENTS 9,660,037 B1 * 5/2017 Zechmann ........ H01L 21/76885
9,807,878 B2 * 10/2017 Tatami ................... H05K 3/027
(Continued)

FOREIGN PATENT DOCUMENTS

DE 102019110840 A1 * 10/2020 ........... G01S 13/931
JP 2016025068 A 2/2016
(Continued)

OTHER PUBLICATIONS

T. Sakai et al., "Nanocarbon Interconnect Technologies for Future LSIs and Memories", Toshiba Review, 2011, vol. 66, No. 2, pp. 46-49 (4 pages).
(Continued)

*Primary Examiner* — Laura M Menz
(74) *Attorney, Agent, or Firm* — Osha Bergman Watanabe & Burton LLP (57) ABSTRACT

The present disclosure relates to a wiring circuit, and a method for producing the wiring circuit, that includes graphite wiring having a specified thickness, a high electrical conductivity, and a high carrier mobility. The wiring circuit may include graphite wiring comprised of graphite where the graphite wiring has a thickness of 3 nm or more and less than 300 nm. The graphite may have an electrical conductivity along a graphite film plane direction of 18000 S/cm or more, and the graphite may have a carrier mobility along the graphite film plane direction of 9500 cm$^2$/Vsec or more. The method for producing a wiring circuit may include steps of: (1) bonding a graphite film with a substrate; (2) plasma etching the graphite film to form a graphite thin film; and (3) etching the graphite thin film to form a wiring circuit.

13 Claims, 1 Drawing Sheet

(51) Int. Cl.
*H01L 21/3213* (2006.01)
*H01L 23/528* (2006.01)
*H01L 23/532* (2006.01)

(56) References Cited

U.S. PATENT DOCUMENTS

| | | | | |
|---|---|---|---|---|
| 10,396,007 | B2* | 8/2019 | Chan | C23C 18/1837 |
| 10,988,384 | B2* | 4/2021 | Tatami | C01B 32/205 |
| 11,081,417 | B2* | 8/2021 | Chan | H01L 23/295 |
| 2003/0230798 | A1* | 12/2003 | Lin | B81B 7/0064 |
| | | | | 257/E23.114 |
| 2009/0212879 | A1* | 8/2009 | Rofougaran | H01P 5/10 |
| | | | | 333/25 |
| 2011/0170231 | A1* | 7/2011 | Chandrasekaran | |
| | | | | H01L 25/0657 |
| | | | | 336/208 |
| 2013/0075906 | A1* | 3/2013 | Matsuda | H01L 24/05 |
| | | | | 257/E21.174 |
| 2015/0334800 | A1* | 11/2015 | Fawaz | H05B 45/385 |
| | | | | 315/294 |
| 2016/0249453 | A1* | 8/2016 | Tatami | C01B 32/205 |
| 2016/0301249 | A1* | 10/2016 | Hammerschmidt | H02J 1/06 |
| 2016/0358871 | A1* | 12/2016 | Yen | H01L 24/10 |
| 2017/0084591 | A1* | 3/2017 | Magnus | H01L 25/16 |
| 2017/0170282 | A1* | 6/2017 | Zechmann | H01L 29/66462 |
| 2017/0256472 | A1* | 9/2017 | Chan | C23C 18/1689 |
| 2017/0331159 | A1* | 11/2017 | Keser | H01M 10/4257 |
| 2019/0300373 | A1* | 10/2019 | Tatami | C01B 32/205 |
| 2019/0341324 | A1* | 11/2019 | Chan | H01L 21/568 |
| 2020/0343626 | A1* | 10/2020 | Rieder | H01Q 21/065 |
| 2020/0388583 | A1* | 12/2020 | Theuss | H01L 25/18 |
| 2020/0402850 | A1* | 12/2020 | Murakami | H01L 21/3065 |
| 2021/0125021 | A1* | 4/2021 | Rieder | H01Q 1/38 |

FOREIGN PATENT DOCUMENTS

| | | | |
|---|---|---|---|
| WO | 2015045641 A1 | 4/2015 | |
| WO | WO-2015045641 A1 * | 4/2015 | ............ B32B 27/20 |
| WO | WO-2019172023 A1 * | 9/2019 | ....... H01L 21/32136 |

OTHER PUBLICATIONS

A. Naeemi et al., "Perfomance Benchmarking for Graphene Nanoribbon, Carbon Nanotube, and Cu Interconnects", 2008, Proc of the 11th IEEE IItC, pp. 183-185 (3 pages).

K. Nagashio et al., "Systematic Investigation of the Intrinsic Channel Properties and Contact Resistance of Monolayer and Multilayer Graphene FET", 2010, J. Appl. Phys., vol. 49, 051304, pp. 1-13 (13 pages).

Y. Zhang et al., "Fabrication and electric-field-dependent transport measurements of mesoscopic graphite devices", 2005, Appl. Phys. Lett., vol. 86, 073104, (3 pages).

H. Al-Mumen et al., "Singular Sheet Etching of Graphene with Oxygen Plasma", Nano-Micro Lett., 2014, vol. 6, No. 2, pp. 116-124 (9 pages).

T. Feng et al., "Multi-layer graphene treated by O2 plasma for transparent conductive electrode applications", Materials Lett., 2012, vol. 73, pp. 187-189 (3 pages).

C-M. Seah et al., "Mechanisms of graphene fabrication through plasma-induced layer-by-layer thinning", Carbon, 2016, vol. 105, pp. 496-509 (14 pages).

International Search Report issued in International Application No. PCT/JP2019/007364, dated May 21, 2019 (1 page).

Written Opinion issued in International Application No. PCT/JP2019/007364, dated May 21, 2019 (3 pages).

* cited by examiner

WIRING CIRCUIT AND METHOD FOR PRODUCING SAME

TECHNICAL FIELD

One or more embodiments of the present disclosure relate to a wiring circuit including graphite wiring, and to a method for producing the wiring circuit.

BACKGROUND

High integration of semiconductor devices is being required, and the contents of the high integration are downsizing of CMOS transistors and miniaturization of wiring. Metal wiring having a wiring width of 300 nm or less (particularly 100 nm or less) is known to have remarkable inelastic scattering of electrons in a crystal grain boundary or interface in connection with miniaturization, and thus cause a sudden increase in wiring resistance. A decrease in a characteristic of current density resistance (that is, this makes it difficult to flow a current) in connection with miniaturization can occur. (Non-Patent Document 1).

In order to address the issues associated with miniaturization of metal wiring, a new material that can replace the metal wiring is being studied, and nanocarbon such as carbon nanotube (CNT) and graphene is being actively researched as a candidate for the new material. Both the nanotube and the graphene are graphite whose basic bonding form is constituted by $SP^2$ bonding. Features of an electrical conductance mechanism of $SP^2$-structure carbon (that is, graphite) and reasons why such carbon is considered to be a candidate for the material capable of replacing the metal wiring are as follows.

The electrical conductivity of a substance is represented by a product of a number of electrons existing in the substance (carrier concentration) and a mobility of the electrons (carrier mobility). A reason why copper has a large electrical conductivity results from its large carrier concentration ($8.9 \times 10^{22}$ $cm^{-3}$), but copper has a value of the carrier mobility of no more than 16 $cm^2$/Vsec. On the other hand, a graphite crystal has a carrier concentration of about $1 \times 10^{19}$ $cm^{-3}$ and a carrier mobility along a graphite crystal basal plane (hereinafter an a-b plane) direction of 8000 to 14000 $cm^2$/Vsec. The carrier concentration of the graphite crystal is 10000 to 100000 times smaller than the carrier concentration of copper, and the carrier mobility of the graphite crystal is 780 to 875 times larger than the carrier mobility of copper. As a result, graphite has an electrical conductivity along the graphite a-b plane direction of nearly 20 times smaller than the electrical conductivity of copper. As described above, graphite is inferior to copper from the viewpoint of the electrical conductivity, but graphite is considered to be, because of its small number of carriers, effective at suppressing the Grain Boundary Effect and the Side Wall Effect in fine copper wiring, when a current is applied. This fact shows a possibility of a high-quality graphite wiring material in a fine wiring having a line width of 300 nm or less (particularly 100 nm or less), and the graphite wiring has a possibility of preventing an increase of resistance caused by making the wiring fine.

Another reason why the graphite wiring is expected is that a heat resistance temperature (decomposition and sublimation temperature) of graphite is nearly 3400° C. and higher than the melting point (1084° C.) of copper, so that the characteristic of current density resistance can be increased. Further, high-quality graphite has a larger thermal conductivity (graphite a-b plane direction: 1000 to 2000 W/mK) than a thermal conductivity of copper (Cu: 400 W/mK), so that high-quality graphite is considered to be able to increase heat dissipation efficiency and shows a possibility of enduring heat generated by applying a large current. Further, the resistance of the graphite a-b plane is hardly increased even when heat is generated by applying a current. Accordingly, unlike with copper, high-quality graphite is considered to be able to avoid a break of wiring caused by self-heating, and such temperature characteristics are considered to also contribute to an improvement in the characteristic of current density resistance.

In techniques for achieving wiring by replacing the metal by conventional nanocarbon, it is difficult to achieve CNT wiring with a low resistance and be formed as fine wiring. A reason why the low resistance of the CNT wiring cannot be achieved is that a contact resistance increases due to its extreme fine and short fiber shape. On the other hand, as a proposal of graphene wiring, there is a proposal of preparing multilayer graphene by a chemical vapor deposition (CVD) method and forming the multilayer graphene into wiring (for example, Non-Patent Document 2). However, the graphene wiring prepared by the CVD method may not satisfy both the necessary thickness and high electrical conductivity. A reason for this results from the fact that among graphene layers formed by the CVD method, only two or three layers in contact with a metal catalyst have good crystallinity (for example, four layers have a thickness of about 1.4 nm), and only a layer with extreme low crystallinity is formed for the graphene thicker than the thickness. That is, it is difficult for the CVD method to form multilayer graphene with a thickness of 2 nm or more, and with high quality in each layer.

In order to deal with this, there is a proposal made by the inventors of one or more embodiments of the present disclosure that aims at using a graphite film in place of the copper wiring (Patent Document 1). The proposal describes a laminated board for wiring that includes a graphite film stacked on an insulating organic polymer film or an insulating inorganic substrate, the graphite film having a thickness in the range of less than 9.6 μm and 20 nm or more, an area of 9 $mm^2$ or more, and a carrier mobility along a graphite a-b plane direction at 25° C. of 8000 $cm^2$/Vsec or more. The proposal describes about partially removing the graphite film by laser to form a wiring circuit. Further, Patent Document 2 describes a composite wiring material that is obtained by preparing a bonded body of a graphite film and copper bonded along a graphite film a-b plane and is made to have a characteristic of current density resistance of $2 \times 10^6$ $A/cm^2$ or more.

These approaches, however, have associated issues of not being able to prepare wiring only formed of graphite having a thickness of 20 nm or less, and that it is difficult to handle a graphite film with a thickness of 300 nm or less as an independent film and thus to establish a production process. Further, the polymer baking method (described later in detail) has difficulties preparing a graphite film having a high electrical conductivity and a characteristic of high carrier mobility and having a thickness of 300 nm or less (particularly 20 nm or less).

PATENT DOCUMENTS

Patent document 1: WO2015/045641
Patent document 2: JPA2016-025068

Non Patent Documents

Non patent document 1: Toshiba Review, Vol. 66, No2, 46 (2011)

Non patent document 2: A. Naeemi and J. D. Meindl, Proc of the 11th IEEE IItC (2008)p. 183

Non patent document 3: K. Nagashio, et al., J. Appl. Phys., 49, 051304(2010)

Non patent document 4: Y. Zhang, et al., Appl. Phys. Lett., 86, 073104(2005)

Non patent document 5: H. Al-Mumen, et al., Nano-Micro Lett., 6(2), 116-124(2014)

Non patent document 6: T. Feng, et al., Materials Lett., 73, 187(2012)

Non patent document 7: C-M. Seah., et al., Carbon, 105, 496(2016)

SUMMARY

One or more embodiments of the present disclosure may provide a wiring circuit that includes graphite wiring having a thickness necessary in semiconductor wiring, a high electrical conductivity, and a high carrier mobility, and to provide a method for producing the wiring circuit.

One or more embodiments of the present disclosure relate to the following wiring circuit.

[1] A wiring circuit comprising graphite wiring,
the graphite wiring having a thickness of 3 nm or more and less than 300 nm,
the graphite having an electrical conductivity along a graphite film plane direction of 18000 S/cm or more, and
the graphite having a carrier mobility along the graphite film plane direction of 9500 $cm^2$/Vsec or more.

[2] The wiring circuit according to [1], wherein the graphite wiring has a sectional area of 0.5 $\mu m^2$ or less.

[3] The wiring circuit according to [1] or [2], wherein the graphite wiring has a line width of 1 µm or less.

One or more embodiments of the present disclosure also relate to the following process for producing a wiring circuit.

[4] A method for producing a wiring circuit, the method comprising steps (1), (2), and (3) in this order:
(1) a bonding step of bonding a graphite film with a substrate;
(2) a plasma etching step of plasma etching the graphite film to form a graphite thin film; and
(3) a wiring circuit formation step of etching the graphite thin film to form a wiring circuit.

[5] The method for producing a wiring circuit according to [4], wherein
the substrate is a silicon substrate.

[6] The method for producing a wiring circuit according to [4], wherein
the substrate is a silicon substrate with an oxide film formed on a surface of the substrate.

[7] The method for producing a wiring circuit according to any one of [4] to [6], wherein
the plasma etching is oxygen plasma etching or air plasma etching.

[8] The method for producing a wiring circuit according to any one of [4] to [7], the method further comprising steps (4), (5) and (6) in an order of (1), (2), (4), (5), (3), and (6):
(4) a resist film formation step of forming a resist film on the graphite thin film;
(5) a resist film circuit formation step; and
(6) a resist film removal step.

[9] The method for producing a wiring circuit according to [8], the method further comprising (7) a graphite film cleaning step, in an order of (7), (1), (2), (4), (5), (3), and (6).

[10] The method for producing a wiring circuit according to [8] or [9], the method further comprising (8) a metal layer formation step of forming a metal layer on a surface of the substrate, in an order of (8), (1), (2), (4), (5), (3), and (6).

[11] The method for producing a wiring circuit according to [10], wherein
the metal layer is selected from the group consisting of nickel, phosphorus, a nickel alloy, a phosphorus alloy, gold, and silver solder.

A wiring circuit of one or more embodiments of the present disclosure including graphite wiring has high electrical conductance and is more useful than wiring circuits including wiring formed of copper.

BRIEF DESCRIPTION OF THE DRAWINGS

FIG. 1A-1H are diagrams showing an exemplary procedure of a process for preparing a wiring circuit, according to one or more embodiments of the present disclosure.

DETAILED DESCRIPTION (Wiring Circuit Including Graphite Wiring)

Graphite wiring is wiring formed of graphite. That is, graphite wiring means both wiring formed of only graphite and wiring including graphite. The first condition satisfied by the graphite wiring is an electrical conductivity along a graphite film plane direction. Graphite used in one or more embodiments of the present disclosure has an electrical conductivity along a graphite film plane direction (graphite basal plane direction, hereinafter an a-b plane) of 18000 S/cm or more, more preferably 19000 S/cm or more, more preferably 20000 S/cm or more, most preferably 21000 S/cm or more.

The graphite having an electrical conductivity of less than 18000 S/cm sometimes causes generation of excessively large Joule heat to be difficult to being used for wiring. The graphite desirably has a higher electrical conductivity, but the upper limit of a theoretical value of the electrical conductivity along the graphite film plane direction is considered to be around 26000 S/cm.

In order to increase the electrical conductivity along the graphite film plane direction, the graphite a-b plane needs to be highly oriented in parallel with the graphite film plane direction. Such orientation may be evaluated by anisotropy of electrical conductivity between the graphite film plane direction and a graphite film thickness direction. The magnitude of the anisotropy (electrical conductivity along graphite film plane direction/electrical conductivity of graphite film thickness direction) in one or more embodiments of the present disclosure is desirably 600 times or more, more preferably 800 times or more, most preferably 1000 times or more.

The second condition satisfied by the graphite wiring is a carrier mobility along the graphite film plane direction. The graphite wiring of one or more embodiments of the present disclosure has a carrier mobility along the graphite film plane direction of 9500 $cm^2$/Vsec or more, more preferably 10000 $cm^2$/Vsec or more, most preferably 11000 $cm^2$/Vsec or more. The upper limit of the carrier mobility is, for example, 15000 $cm^2$/Vsec.

The graphite wiring preferably has a good characteristic of current density resistance. A value of the characteristic of current density resistance differs depending on a sectional area and a shape of wiring and measurement conditions, so that the graphite wiring needs to exceed the characteristic of current density resistance of the copper wiring having the same sectional area and the same shape and measured under the same measurement conditions. The fact that the characteristic of current density resistance differs depending on the shape of wiring results from the fact that the heat dissipation characteristics differ depending on the shape of the wiring.

The graphite wiring of one or more embodiments of the present disclosure has a sectional area of preferably 0.5 μm² or less, more preferably 0.4 μm² or less, most preferably 0.3 μm² or less.

The graphite wiring having even a sectional area of 0.5 μm² is made to have a thickness of, for example 50 nm and a line width of 10 μm to further improve the characteristic of current density resistance. The purpose of using the graphite wiring, however, is to prevent a sudden increase of a resistance value accompanying making the metal wiring fine, and the sudden increase of the resistance value is a phenomenon that particularly remarkably appears when the wiring width is 1 μm or less. Accordingly, when a sectional area of the wiring in one or more embodiments of the present disclosure is 0.5 μm² or less, a condition of a line width of 1 μm or less is substantially given to the wiring.

That is, the graphite wiring needs to satisfy the following three conditions.

(1) The wiring has a thickness of 3 nm or more and less than 300 nm.

(2) Graphite has an electrical conductivity along a graphite film plane direction of 18000 S/cm or more.

(3) Graphite has a carrier mobility along the graphite film plane direction of 9500 cm²/Vsec or more.

Particularly, even the wiring having a sectional area of 0.5 μm² or less (usually 0.005 μm² or more) and a line width of 1 μm or less (usually 0.3 μm or more) can have a characteristic of current density resistance of $5.0 \times 10^6$ A/cm² or more, and has a characteristic of current density resistance of preferably $1.0 \times 10^7$ A/cm² or more, more preferably $1.5 \times 10^7$ A/cm² or more. The upper limit of the characteristic of current density resistance is not particularly limited but is, for example, $5.0 \times 10^7$ A/cm².

(Preparation of Graphite Film)

Preparing a graphite film having a thickness of 3 nm or more and less than 300 nm and the electric and electron physical properties described above is difficult by a general production process for graphite. A method for heat-treating a special polymer film to graphitize the polymer film (hereinafter a polymer baking method) gives large-area graphite but frequently generates wrinkles during baking in the preparation of graphite having a film thickness of 300 nm or less, and further such graphite is difficult to be handled. Thus, a high-quality graphite film becomes very difficult to be prepared.

In one or more embodiments of the present disclosure, it is preferable to prepare in advance a high-quality graphite film having a thickness in the range of 500 nm or more and less than 9.6 μm and to plasma etch the graphite film in a circuit formation step and thus thin the graphite film. This procedure is based on a finding that first, the high-quality graphite film having a film thickness in the range of 500 nm or more and less than 9.6 μm is relatively easily prepared, plasma etching performed on the highly oriented and high-quality graphite film uniformly progresses by selecting etching conditions appropriately, and the graphite film that has been thinned hardly has a change in the physical properties.

In one or more embodiments of the present disclosure, a graphite film is preferably prepared having, first of all, a thickness in the range of 500 nm or more and less than 9.6 μm, an electrical conductivity along a graphite film plane direction of 18000 S/cm or more, and a carrier mobility along the graphite film plane direction of 9500 cm²/Vsec or more. A method for producing the graphite film is not basically limited as long as the graphite film produced satisfies the characteristics such as the electrical conductivity and the carrier mobility. The polymer baking method, however, is the most preferable method as the method for producing the graphite film.

A general approach of the polymer baking method is as follows. Raw material polymers used are aromatic polymers such as an aromatic polyimide, a polyamide, polyquinoxaline, polyparaphenylene vinylene, polyoxadiazole, and polybenzoimidazole. Among these polymers, the aromatic polymer is particularly preferably a polyimide prepared by combining pyromellitic anhydride or 3,3',4,4'-biphenyltetracarboxylic dianhydride, and either of 4,4'-diaminodiphenyl ether or p-phenylenediamine.

In the polymer baking method, a polymer film as a starting material is preheated in an inert gas to carbonize the polymer film. As the inert gas, nitrogen, argon, or a mixed gas of argon and nitrogen is preferably used. The preheating is usually performed at a temperature of around 1000° C. Usually, a polyimide film is thermally decomposed at approximately 500 to 600° C. and carbonized at approximately 1000° C.

A graphitization reaction is performed by setting the carbonized film in an ultrahigh temperature furnace. The graphitization is performed in an inert gas at a temperature of usually around 2800° C. As the treatment temperature is higher, the film is converted to better graphite. The treatment temperature (highest treatment temperature) for obtaining the graphite film is usually preferably 2700° C. or more, and the treatment at a temperature of 2800° C. or more is said to be more preferable.

The method for preparing graphite in one or more embodiments of the present disclosure needs two conditions different from the conditions of the general polymer baking method described above. The first condition is graphitization temperature. The graphitization temperature necessary in one or more embodiments of the present disclosure is 3000° C. or more. The treatment is performed at a temperature of more preferably 3100° C. or more, most preferably 3200° C. or more. The upper limit of the graphitization temperature is not particularly limited but may be around 3300° C. A retention time at the highest treatment temperature is, for example, 10 minutes or more, preferably 20 minutes or more. A highest treatment temperature of less than 3000° C. makes it difficult to prepare a graphite film having the necessary physical properties.

The second condition is the thickness of the starting raw material film. The starting polymer film preferably has a thickness in the range of 1 μm to 19.2 μm in one or more embodiments of the present disclosure. As regards the aromatic polyimide, the starting polymer treated at 3000° C. becomes almost half in thickness. Thus, the above thickness range of the starting polymer film means that a graphite thin film having a thickness of 500 nm or more and less than 9.6 μm is obtained as a result. The graphite thin film having the characteristics of an electrical conductivity along the graphite film plane direction of 18000 S/cm or more and a carrier mobility along the graphite film plane direction of 9500 cm²/Vsec or more is obtained by selecting such a highest treatment temperature for the graphitization and an optimal film thickness. Such a graphite film has a thickness region thinner than the film thickness of the graphite film obtained by the general polymer baking method described above, and also has a larger value of the electrical conductivity along the graphite film plane direction.

(Circuit Formation Process (Summary))

A wiring circuit including graphite wiring is prepared from a graphite film. One exemplary process of the preparation is shown in FIG. 1 and is described below.

Figure 1A:
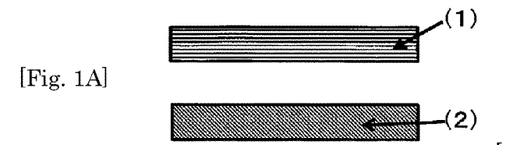

In FIG. 1A a graphite film (1) is, by the polymer baking method, prepared having a thickness in the range of 500 nm or more and less than 9.6 μm, an electrical conductivity along a graphite film plane direction of 18000 S/cm or more, and a carrier mobility along the graphite film plane direction of 9500 cm$^2$/Vsec or more. Further, a silicon substrate (2) is prepared.

In FIG. 1B at least a surface of the graphite film, preferably both surfaces (3) of the graphite film (1) and the silicon substrate (2) are cleaned (also referred to as a step (7)).

In FIG. 1C the graphite film (1) is bonded with the silicon substrate (2) along a portion (4) (step (1)).

Figure 1D:
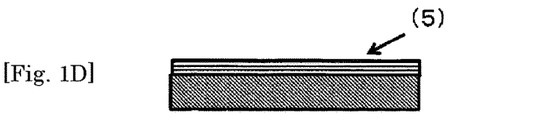

In FIG. 1D the graphite film (1) is plasma etched to form a graphite thin film (5) (step (2)).

Figure 1E:
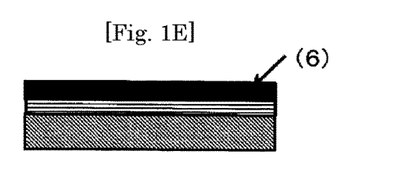

In FIG. 1E a resist film (6) is formed on the graphite thin film (5) (step (4)).

Figure 1F:
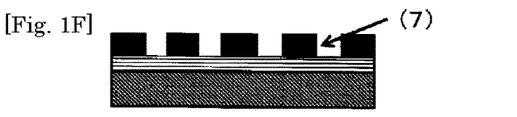

In FIG. 1F a circuit pattern (7) of the resist film is prepared by lithographic exposure (step (5)).

Figure 1G:
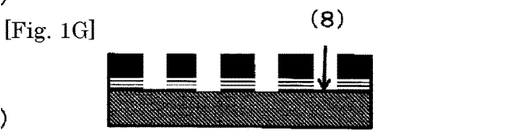

In FIG. 1G a portion of the graphite thin film (8) exposed by the removal of the resist film is removed by etching (step (3)).

Figure 1H:
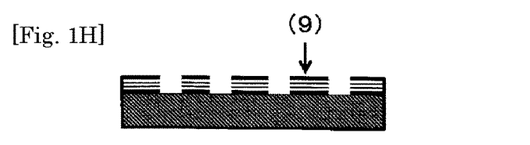

In FIG. 1H the remaining resist film is removed (step (6)) to complete a wiring circuit including graphite wiring.

Further, if necessary, it is also possible to complete a device by stacking each of wiring circuit formed of a wiring and a silicon substrate, the wiring being formed of a graphite thin film, forming a via hole penetrating the circuits, and filling the via hole with a conductive material to connect the plurality of circuits to each other.

Hereinafter, each process is described.

(Process 1)

According to the method described above, a graphite film having a thickness in the range of 500 nm or more and less than 9.6 μm, an electrical conductivity along a graphite film plane direction of 18000 S/cm or more, and a carrier mobility along the graphite film plane direction of 9500 cm$^2$/Vsec or more is prepared.

(Processes 2 and 3)

In the process 2 (step (7)), the graphite film is cleaned (for example, washing with water or an organic solvent, or ion beam or plasma surface cleaning), preferably both surfaces of the graphite film and a substrate are cleaned (preferably washed). In the process 3 (step (1)), the graphite film is bonded with the substrate. A reason why the process 3 is performed is that plasma etching performed in the process 4 (step (2)) is preferably performed with the graphite film attached to the substrate. A more specific reason is that the graphite film is uniformly thinned by retaining the surface of the graphite film flat, and that a device is easily prepared in subsequent processes by thinning the graphite film and forming a circuit with attaching the graphite film to the substrate.

The substrate to which the graphite film is attached is not particularly limited, but a silicon substrate or a silicon substrate with a silicon oxide film on its surface is preferable for making a fine wiring circuit. The graphite film and the silicon substrate may be bonded directly without any bonding layer or may be bonded with some kind of bonding layer interposed between the graphite film and the silicon substrate.

The direct bonding between the substrate (preferably the silicon substrate) and the graphite film is a preferable bonding approach for the process of one or more embodiments of the present disclosure. The direct bonding may be performed at normal temperature or at a temperature of 400° C. or less. The direct bonding is preferably performed in a vacuum atmosphere or in an inert gas. The direct bonding performed at a temperature of more than 400° C. is not preferable because such bonding sometimes generates peeling due to a difference in the coefficient of expansion between the material (preferably silicon) for the substrate and graphite. In order to achieve good direct bonding, the graphite surface and the substrate (preferably the silicon substrate) surface are preferably flat and smooth and clean, and the surfaces are preferably treated by ion beams, argon plasma, or oxygen plasma for cleaning. Further, the substrate (preferably the silicon substrate or the silicon oxide substrate) surface or the graphite surface may be activated by a method known by a person skilled in the art as necessary.

When the graphite film is bonded with the substrate with a bonding layer interposed between the graphite film and the substrate, the bonding layer is preferably a layer of at least one metal selected from the group consisting of nickel, a nickel alloy, phosphorus, a phosphorus alloy, gold, and silver solder, and is more preferably at least one metal selected from the group consisting of nickel, phosphorus, a nickel alloy, and a phosphorus alloy. The metal layer serving as the bonding layer may be formed only on at least either of the substrate surface or the graphite film surface, and is preferably formed on the substrate surface (step (8)). The bonding with a metal is performed under pressure during heating, and the optimal temperature, pressure, and treatment time can be employed for the bonding. The optimal temperature, pressure, and treatment time can be employed for the bonding with silver solder. When the bonding with silver solder is performed under pressure during heating, the temperature is preferably 400° C. or more and 900° C. or less and the pressure is 1 kgf/cm$^2$ or more and 300 kgf/cm$^2$ or less. The thickness of the silver solder used for the bonding is preferably 2 μm or less, more preferably 1 μm or less, and usually 0.5 μm or more. The bonding with nickel is preferably performed at 800 to 900° C. under a pressure of 1 kgf/cm$^2$ or more and 300 kgf/cm$^2$ or less. A nickel layer used for the bonding is preferably 40 nm or less, more preferably 20 nm or less, further preferably 10 nm or less. The lower limit is not particularly limited but is, for example, 5 nm.

(Process 4) (Step (2))

Next, the graphite film is subjected to a plasma etching treatment to thin the graphite film. Plasma is a state in which positively charged particles and negatively charged electrons are ionized and distributed in similar amount to keep electrical neutrality, and an important thing is that the thinning of the graphite film by plasma does not change (degrade) the physical properties of graphite. As a result of studies on some etching approaches, a fact is found that the plasma etching method is an excellent method capable of progressing uniform thinning of the graphite film at a preferable rate, hardly changing the physical properties of the graphite film. Among the plasma etching approaches, etching by oxygen plasma, air plasma, or hydrogen plasma is the most excellent method in terms of the etching rate and the uniform thinning, and etching by oxygen plasma or air plasma is more preferable.

Use of a highly oriented and high-quality graphite film enables uniform etching even when the graphite film is thinned at an etching rate high enough to establish an industrial process. It is reported that a single to several layers (two or three layers) of graphene can be prepared through etching (several-layer) multilayer graphene by very weakly ionized oxygen plasma, the multilayer graphene being prepared by the CVD method (Non-Patent Documents 5 to 7). This report means that the very weakly ionized plasma enables uniform progress of the etching. The uniform etching, however, has not been known to be possible even at a high rate. For example, as indicated in EXAMPLES, etching even at a rate of 350 nm/30 min does not impair the flatness and smoothness of the graphite film. A thickness of 350 nm corresponds to a 1000 or more layers of graphene.

A reason why the etching at such a rate is possible results from the fact that graphite as a base material is a highly oriented material and graphite layers are bonded each other with relatively weak van der Waals force, and thus the plasma etching progresses similarly to interlayer peeling. As regards the plasma etching performed on the multilayer graphene prepared by the CVD method as disclosed in Non-Patent Documents 5 to 7, since the portion etched by the CVD method is presumed to be a low-crystallinity carbon layer, such an amorphous carbon portion is presumed to be removable by the plasma etching. A new finding, however, is the fact that the plasma etching enables thinning of such a high-quality graphite film of one or more embodiments of the present disclosure by a similar mechanism to the mechanism of the interlayer peeling.

On the other hand, etching conditions are also important for the achievement of the uniform thinning. For example, the plasma etching using a fluorine-based (e.g., $CF_4$) active gas proceeds at a high etching rate to have difficulties achieving the uniform thinning of the graphite film of one or more embodiments of the present disclosure by selection of reaction conditions of the active gas and have difficulties controlling the thickness of the graphite film in the range of 2 nm to 300 nm. The etching using an active gas such as $CF_4$, however, can be effectively used for the purpose of forming a via hole (through hole) in the graphite film.

In one or more embodiments of the present disclosure, the etching rate is preferably 200 nm/min to 0.2 nm/min, more preferably 50 nm/min to 0.5 nm/min, most preferably 20 nm/min to 1 nm/min. A change of the etching rate in the etching process is effective. For example, a method in which the initial etching rate is set high to a desired thickness and then the etching rate is set low is preferably use.

An electrical discharge system is categorized into high-frequency discharge (radio frequency (RF)) and microwave discharge according to the frequency of a power source used for generation of plasma. Further, a plasma generation system includes a microwave ECR plasma system, a capacitively coupled plasma (CCP) system, and an inductively coupled plasma (ICP) system. In one or more embodiments of the present disclosure, the system is not limited as long as the uniform etching is possible without impairing the physical properties of graphite. Specific experimental conditions used are described later, and such conditions can be easily replicated using a commercially available ICP plasma device or CCP plasma device.

The graphite film bonded onto the substrate (preferably the silicon substrate) is thinned to an optimal thickness by the plasma etching. This process makes the graphite film having a thickness of 500 nm or more and less than 9.6 μm into a graphite thin film having a thickness in the range of 3 nm or more and less than 300 nm. In principle, even use of the graphite film having a thickness of 9.6 μm or more enables preparation of the graphite thin film in the range of 3 nm or more and less than 300 nm by a method for, for example, prolonging the etching time. Making the graphite film having a thickness of 9.6 μm or more into a thickness of 300 nm or less by the plasma etching, however, is wasteful in terms of the time and energy.

That is, one or more embodiments of the present disclosure is characterized by preparing a graphite film having a thickness of 500 nm or more and less than 9.6 μm in advance, and preparing a graphite thin film in the range of 3 nm or more and less than 300 nm by the plasma etching. The plasma etching never degrades the physical properties of graphite, so that a high-quality graphite thin film that is very difficult to be prepared is prepared, the graphite thin film having a thickness of 3 nm or more and less than 300 nm, an electrical conductivity along a graphite film plane direction of 18000 S/cm or more and a carrier mobility along the graphite film plane direction of 9500 $cm^2$/Vsec or more.

There are two reasons why it is very difficult to directly prepare the graphite thin film having such a thickness and physical properties without the plasma etching process. The first reason is, as described above, that a very thin polymer raw material film makes it difficult to obtain high-quality graphite. The second reason is that it is difficult to handle the graphite thin film having a thickness in the range of 3 nm or more and less than 300 nm singly as an independent film, and therefore even when such a graphite thin film can be prepared, it is virtually impossible to construct a fine circuit formation process with use of the graphite thin film. As described above, the plasma etching performed on the graphite film integrated with the substrate can be used for preparing graphite wiring having a thickness of 300 nm or less (particularly less than 300 nm). Particularly, one or more embodiments of the present disclosure is a preferable approach of forming graphite wiring having a thickness of 20 nm or less.

(Process 5)

A photoresist film is formed on an upper surface of the graphite thin film that is bonded onto the silicon substrate and has an optimally thinned thickness (step (4)). The resist film plays a role of protecting a wiring portion of the graphite thin film in the following etching step of the graphite thin film (step (3)). The resist film is not particularly limited as long as it enables preparation of a circuit having a desired wiring width, but a micro photoresist used for formation of a fine circuit pattern is preferable for the purpose of one or more embodiments of the present disclosure. Use of such a micro photoresist enables formation of a wiring pattern having a line width of 1 μm or less.

Forming a wiring pattern formed of the graphite thin film by a photoresist is performed according to each of processes: (p1) surface cleaning, and a graphite thin film surface treatment in which a surface of the graphite thin film is made hydrophobic to improve adhesiveness of the surface and thus increase application performance; (p2) uniform application of a photoresist; (p3) pre-baking performed for the purpose of evaporating a solvent; (p4) an exposure step in which a photomask is aligned with the graphite thin film and a pattern is transferred to the photoresist by application of light; (p5) a developing step of removing unexposed portion in the photoresist; and (p6) post-baking performed for the purpose of improving adhesiveness by thermal crosslinking. In these processes, known approaches used in a semiconductor lithography process are preferably usable. The wiring pattern of the photoresist formed here coincides with the wiring pattern formed by the graphite thin film, and the removal of the unexposed portion in the photoresist exposes the graphite thin film to be removed in the following process (step (3)).
(Processes 6 and 7)

Next, the exposed portion of the graphite thin film is removed by etching (step (3)). An etching approach is not particularly limited, and known approaches used in a semiconductor lithography process are preferably usable. Among the approaches, plasma etching, particularly etching by oxygen plasma or hydrogen plasma is preferably used for the etching of the graphite thin film. After the removal of the unnecessary graphite portion, the photoresist layer is removed (step (6)) to complete a wiring circuit including graphite wiring. An approach of removing the photoresist layer is not particularly limited, and known approaches used in a semiconductor lithography process are preferably usable.

A metal layer may be further separately provided to the formed wiring including graphite wiring. Such a metal layer is preferably formed on a surface of the graphite layer before the formation of the circuit by the photoresist, and the metal layer improves the electrical conductivity of the graphite wiring. As a method for forming the metal layer, any of various types of dry plating such as vapor deposition, sputtering, and CVD, and wet plating such as non-electrolytic plating and electrolytic plating is applicable. Examples of the type of the non-electrolytic plating include non-electrolytic copper plating, non-electrolytic nickel plating, non-electrolytic gold plating, non-electrolytic silver plating, and non-electrolytic tin plating. Further, when the graphite layer and the silicon substrate are bonded with a metal, the metal layer is usable as a part of the circuit. An unnecessary portion of the metal layer formed is removed in the plasma etching step.
(Process 8)

Wiring circuits that each include the graphite wiring formed on the silicon by the approach described above are stacked on one another as necessary. A stacking method is not particularly limited, and a usual method for stacking a silicon substrate is usable. A plurality of silicon substrates are preferably directly bonded with each other.

In order to vertically connect each of the graphite circuits formed on each layer, a via hole penetrating the plurality of silicon substrates is formed as necessary. Such a via hole may be formed by publicly known laser for processing, such as carbon dioxide laser, YAG laser, $YVO_4$ laser, fiber laser, or excimer laser. For example, the hole may also be formed by plasma etching using an active gas such as $CF_4$.

After the formation of the hole, the hole formed is filled with a conductive paste or the like to form vertical wiring (via). As an approach for forming the via, many approaches for achieving good wiring are known. Also in the graphite wiring of one or more embodiments of the present disclosure, the via can be formed by any means known by a person skilled in the art.

In contrast to metal wiring circuits, the graphite wiring prepared never increases a resistance value by being made fine. Further, the graphite wiring is characterized by having a very high thermal conductivity along a graphite wiring plane direction and thus efficiently dissipating heat and is also characterized by having a very small coefficient of thermal expansion and thus being capable of preventing embrittlement of the wiring circuit caused by a difference in the coefficient of thermal expansion between the wiring and the substrate. The processes of one or more embodiments of the present disclosure prepare the silicon substrate on which the graphite wiring has been formed. Semiconductor devices including such a silicon substrate are achievable by any means known by a person skilled in the art.

The present application claims priority based on Japanese Patent Application No. 2018-042640 filed on Mar. 9, 2018. All the contents described in Japanese Patent Application No. 2018-042640 filed on Mar. 9, 2018 are incorporated herein by reference.

EXAMPLES

<Measurement of Electrical Conductivity and Carrier Mobility>

The electrical conductivity of the graphite thin film was measured by the van der Pauw method. The measurement was performed by using a sample cut in a square (20 mm×20 mm) and attaching a silver paste electrode to each of the four corners. The device used for measurement was Resistivity/DC & AC Hall measurement system, ResiTest 8300 manufactured by TOYO Corporation.

A carrier mobility and a carrier concentration were measured by applying a magnetic field to the sample used for measuring the electrical conductivity and by measuring a Hall coefficient of the sample. In a calculation for cases such as graphite where an almost equal number of electrons and holes are present, analysis needs to be made using the Newton method. In the analysis, three simultaneous equations are set up from four parameters as a total and three types of measurement values, so that an assumption is needed. The four parameters are the electron density, the hole density, the electron mobility, and the hole mobility, and the three types of measurement values are the electrical conductivity, the Hall coefficient, and the magnetic resistance. The assumption is that graphite has an equal mobility (or density) between electrons and holes. We also numerically calculated the carrier density and the carrier mobility with the assumption.
<Preparation of Graphite Film>

A raw material polymer film was prepared by the following method. Into 100 g of a 18% by mass dimethylformamide (DMF) solution of polyamic acid synthesized from pyromellitic anhydride and 4,4'-diaminodiphenyl ether in the mole ratio of 1:1, a curing agent formed of 20 g of acetic anhydride and 10 g of isoquinoline was mixed, and the mixture was stirred, defoamed by centrifugal separation, then applied by casting onto an aluminum foil, and further subjected to spin coating with a spin coater, to prepare on the aluminum foil a polyamic acid film having a uniform thickness in the range of 1 μm to 10 μm. The thickness of the film was adjusted by changing the concentration of the amic acid solution and the number of rotations. The polyamic acid film was heated at 120° C. for 150 seconds and at 300° C., 400° C., and 500° C. for 30 seconds each, and then the aluminum foil was removed. Thus, four types of polyimide films having different thicknesses were prepared.

Each of the polyimide films (area: 40×40 $mm^2$) was pretreated by raising the temperature to 1000° C. at a rate of 10° C./min in a nitrogen gas with use of an electric furnace and keeping the temperature at 1000° C. for 1 hour. Next, the resultant carbonized sheet was set in a cylindrical graphite heater, and the temperature was raised to a treatment temperature (highest treatment temperature) of 3000 to 3200° C. at a heating rate of 20° C./min. This temperature was retained for 30 minutes (treatment time) and then lowered at a rate of 40° C./min. Thus, a graphite film was prepared. The treatment was performed in an argon atmosphere under a pressure of 0.10 MPa (1.0 $kg/cm^2$). By changing the highest treatment temperature, six types of graphite films were prepared. The area of the resultant graphite films was in the range of 1480 mm² to 1200 mm². The interior of the graphite films was constituted by a very neatly oriented layer structure and the graphite films had high orientation along a graphite plane direction.

As regards the six types of graphite films (samples 1 to 6), Table 1 shows the highest treatment temperature (° C.), thickness (μm), the electrical conductivity (S/cm) along the graphite film plane direction, and the carrier mobility (cm²/Vsec) along the graphite film plane direction. These graphite films have a thickness in the range of 4.6 μm to 720 nm, and the graphite films in such a thickness range had an electrical conductivity in the range of 19040 to 24300 S/cm and a carrier mobility in the range of 9700 to 12200 cm²/Vsec. Further, the graphite films had an electrical conductivity along a graphite film thickness direction in the range of 6.0 to 8.5 S/cm.

<Plasma Etching Device>

Figure 2:
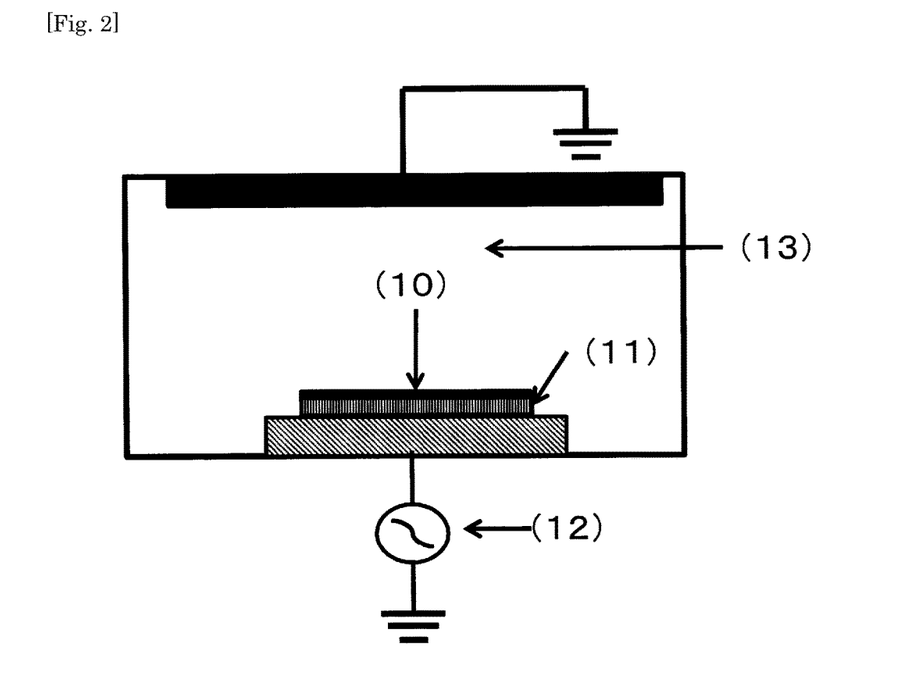
FIG. 2 is a schematic sectional view of an exemplary plasma etching device, as described in one or more embodiments of the present disclosure.

FIG. 2 shows a schematic view of an AC plasma etching device (a magnetron method and an alternating electric field method) used in examples. The device is manufactured by Kabushiki Kaisha Vacuum Device (PIB-20). This device allows selection of a discharge voltage from 0 V to 700 V and a discharge current from 0 mA to 50 mA. The maximum power (irradiation power) is 35 W. Plasma is selectable from any of air plasma, oxygen plasma, argon plasma, or hydrogen plasma. The operating pressure is selectable from 0 to 100 Pa.

Using the plasma etching device, a relationship between etching conditions and an etching rate was studied. (1) Under the conditions of air plasma, an irradiation power of 35 W, and etching rate of 11.7 nm/min, the surface roughness was not changed by the etching. (2) Under the conditions of air plasma, an irradiation power of 28 W, and etching rate of 1.7 nm/min, the surface roughness was improved. (3) Under the conditions of oxygen plasma, an irradiation power of 35 W, and etching rate of 48 nm/min, the surface roughness was hardly changed by the etching. (4) Under the conditions of oxygen plasma, an irradiation power of 28 W, and etching rate of 6.7 nm/min, the surface roughness was improved.

Example 1

The sample 1 was bonded with a silicon substrate using silver solder. The graphite film and the silicon substrate were washed with an organic solvent and then bonded with each other using 1-μm thick silver solder (silver solder containing titanium) by a treatment of heating at 830° C. for 10 minutes under a pressure (about 1 kgf/cm²). A peeling experiment was performed, but all the peeling occurred between graphite layers and no peeling was observed in an interface between the graphite film and the silicon substrate. This fact led to a conclusion that the bonding was very strongly made. Next, oxygen plasma irradiation was performed at an irradiation power of 35 W for 88 minutes. Further, etching was performed in oxygen plasma at an irradiation power of 28 W for 12 minutes. As a result, the resultant graphite thin film had a thickness of 280 nm. The graphite thin film had a value of the electrical conductivity of 23300 S/cm and a value of the carrier mobility of 11600 cm²/Vsec. This fact showed that the values of the electrical conductivity and the carrier mobility are hardly changed by the plasma etching.

Example 2

The bonding with a silicon substrate was performed in the same manner as in Example 1 except using the sample 2. This fact led to a conclusion that sufficient bonding was made. Next, oxygen plasma irradiation was performed at an irradiation power of 35 W for 35 minutes. Further, etching was performed in oxygen plasma at an irradiation power of 28 W for 40 minutes. The resultant graphite thin film had a thickness of 120 nm. The graphite thin film had a value of the electrical conductivity of 24000 S/cm and a value of the carrier mobility of 12000 cm²/Vsec. This fact showed that the values of the electrical conductivity and the carrier mobility are hardly changed by the plasma etching.

Example 3

The sample 3 and a silicon substrate were bonded with each other with a nickel metal. A nickel metal layer (estimated to be a thickness of around 10 nm) was formed on the silicon substrate and bonded with the graphite film by a treatment of heating at 800° C. under a pressure (about 1 t). A peeling experiment was performed, but all the peeling occurred between graphite layers and no peeling was observed in an interface between the graphite film and the silicon substrate. This fact led to a conclusion that sufficient bonding was made. Next, oxygen plasma irradiation was performed at an irradiation power of 35 W for 24 minutes. Further, etching was performed in oxygen plasma at an irradiation power of 28 W for 40 minutes. The resultant graphite thin film had a thickness of 80 nm. The graphite thin film had a value of the electrical conductivity of 21200 S/cm and a value of the carrier mobility of 11800 cm²/Vs. This fact showed that the values of the electrical conductivity and the carrier mobility are hardly changed by the plasma etching.

Example 4

Direct bonding of the sample 4 with a silicon substrate was attempted. First, a surface of the graphite film and a surface of the silicon substrate were subjected to surface cleaning using an AC plasma device (manufactured by Kabushiki Kaisha Vacuum Device, (PIB-20) magnetron and alternating electric field). As experimental conditions, values of discharge voltage and discharge current were a voltage AC of 0 to 700 V and a current AC of 0 to 50 mA (maximum 35 W). The surface cleaning was performed by exposing the surfaces of the graphite film and the silicon substrate to plasma for 5 seconds using an oxygen gas. Next, the graphite was stacked on the silicon substrate and pressed (load: 10 kgf/cm²) at normal temperature. After the pressure treatment, an adhesive tape was attached to a graphite surface, and a peeling experiment was performed. The peeling experiment resulted in generation of peeling between graphite layers. This result led to a conclusion that the graphite film was bonded with the silicon substrate. Next, oxygen plasma irradiation was performed at an irradiation power of 35 W for 15 minutes. Further, etching was performed in oxygen plasma at an irradiation power of 28 W for 65 minutes. The resultant graphite thin film had a thickness of 42 nm. The graphite thin film had a value of the electrical conductivity of 20600 S/cm and a value of the carrier mobility in the range of 10060 cm²/Vsec. This fact showed that the values of the electrical conductivity and the carrier mobility are hardly changed by the plasma etching.

Example 5

A bonding experiment was performed in the same manner as in Example 4 except using the sample 5. Next, oxygen plasma irradiation was performed at an irradiation power of 35 W for 9 minutes. Further, etching was performed in oxygen plasma at an irradiation power of 28 W for 40 minutes. The resultant graphite thin film had a thickness of 26 nm. The graphite thin film had a value of the electrical conductivity of 19000 S/cm and a value of the carrier mobility of 9200 cm$^2$/Vsec. This fact showed that the values of the electrical conductivity and the carrier mobility are hardly changed by the plasma etching.

Example 6

Direct bonding of the sample 6 with a silicon substrate was performed. First, a surface of the graphite film and a surface of the silicon substrate were subjected to surface cleaning using an AC plasma device (manufactured by Kabushiki Kaisha Vacuum Device, (PIB-20) magnetron and alternating electric field). As experimental conditions, values of discharge voltage and discharge current were a voltage AC of 0 to 700 V and a current AC of 0 to 50 mA (maximum 35 W). The surface cleaning was performed by exposing the surfaces of the graphite film and the silicon substrate to plasma for 5 seconds using an oxygen gas. Next, the graphite was stacked on the silicon substrate and pressed (load: 10 kgf/cm$^2$) at normal temperature. After the pressure treatment, an adhesive tape was attached to a graphite surface, and a peeling experiment was performed. The peeling experiment resulted in generation of peeling between graphite layers. This result led to a conclusion that the graphite film was directly bonded with the silicon substrate. Next, oxygen plasma irradiation was performed at an irradiation power of 35 W for 12 minutes. Further, etching was performed in oxygen plasma at an irradiation power of 28 W for 20 minutes. The resultant graphite thin film had a thickness of 14 nm. The graphite thin film had a value of the electrical conductivity of 21800 S/cm and a value of the carrier mobility of 10100 cm$^2$/Vsec. This fact showed that the values of the electrical conductivity and the carrier mobility are hardly changed by the plasma etching.

Example 7

Direct bonding of the sample 6 with a silicon substrate was performed in the same manner as in Example 6. Next, oxygen plasma irradiation was performed at an irradiation power of 35 W for 12 minutes. Further, etching was performed in air plasma at an irradiation power of 28 W for 300 minutes. The resultant graphite thin film had a thickness of 8 nm. The graphite thin film had a value of the electrical conductivity of 21000 S/cm and a value of the carrier mobility of 9800 cm$^2$/Vsec. This fact showed that the values of the electrical conductivity and the carrier mobility are hardly changed by the plasma etching.

Example 8

Direct bonding of the sample 6 with a silicon substrate was performed in the same manner as in Example 6. Next, oxygen plasma irradiation was performed at an irradiation power of 35 W for 12 minutes. Further, etching was performed in air plasma at an irradiation power of 28 W for 350 minutes. The resultant graphite thin film had a thickness of 3.1 nm. The graphite thin film had a value of the electrical conductivity of 20100 S/cm and a value of the carrier mobility of 9500 cm$^2$/Vsec. This fact showed that the values of the electrical conductivity and the carrier mobility are hardly changed by the plasma etching.

Table 1 summarizes the characteristics of the graphite thin films obtained in Examples 1 to 8.

TABLE 1

|  | | Graphite film | | | Graphite thin film | | |
| --- | --- | --- | --- | --- | --- | --- | --- |
|  | Sample | Thickness (μm) | Electrical conductivity (S/cm) | Carrier mobility (cm$^2$/Vs) | Thickness (nm) | Electrical conductivity (S/cm) | Carrier mobility (cm$^2$/Vs) |
| Example 1 | Sample 1 | 4.6 | 23900 | 11800 | 280 | 23300 | 11600 |
| Example 2 | Sample 2 | 2 | 24300 | 12200 | 120 | 24000 | 12000 |
| Example 3 | Sample 3 | 2.1 | 22000 | 12040 | 80 | 21200 | 11800 |
| Example 4 | Sample 4 | 1.2 | 21500 | 10880 | 42 | 20600 | 11060 |
| Example 5 | Sample 5 | 1.2 | 19040 | 9700 | 26 | 19000 | 9200 |
| Example 6 | Sample 6 | 0.72 | 22000 | 10500 | 14 | 21800 | 10100 |
| Example 7 | Sample 6 | 0.72 | 22000 | 10500 | 8 | 21000 | 9800 |
| Example 8 | Sample 6 | 0.72 | 22000 | 10500 | 3.1 | 20100 | 9500 |

Example 9

The graphite thin films (film thicknesses of 280 nm and 42 nm) prepared in Examples 1 and 4 were subjected to Processes 5 to 8 for forming a circuit to form a wiring circuit. The circuit prepared had a width of 1 μm and a length of 10 μm. A DC current was applied to the resultant sample to measure a characteristic of current density resistance. The measurement was performed in an environment of an inert gas (argon or nitrogen) at 25° C. The graphite circuit having a thickness of 280 nm (=0.28 μm) (that is, having a wiring sectional area of 1 μm×0.28 μm=0.28 μm$^2$) had a characteristic of current density resistance of 1.5×10$^7$ A/cm$^2$, and was equivalent to the characteristic of current density resistance of copper wiring having the same shape. The graphite thin film having a thickness of 42 nm (=0.042 μm) (that is, having a wiring sectional area of 1 μm×0.042 μm=0.042 μm$^2$) was improved in the characteristic of current density resistance to have a characteristic of current density resistance of 1.9×10$^7$ A/cm$^2$, which exceeded the characteristic of current density resistance of copper wiring having the same size. This fact led to a conclusion that the graphite wiring having a thickness of 280 nm or less has a higher characteristic of current density resistance than the characteristic of current density resistance of copper wiring. Accordingly, the graphite wiring circuit obtained by such an approach is shown to be very useful as a semiconductor fine circuit.

DESCRIPTION OF REFERENCE SIGNS

1 Graphite film
2 Silicon substrate

3 Portions to be cleaned on surfaces of graphite film and silicon substrate
4 Bonded portion
5 Plasma etched graphite thin film
6 Resist film
7 Circuit pattern of resist film
8 Graphite thin film exposed by removal of resist film
9 Wiring circuit including graphite wiring
10 Graphite film
11 Substrate
12 High-frequency power source
13 Plasma (oxygen, air, or hydrogen)

Although the disclosure has been described with respect to only a limited number of embodiments, those skilled in the art, having benefit of this disclosure, will appreciate that various other embodiments may be devised without departing from the scope of the present disclosure. Accordingly, the scope of the disclosure should be limited only by the attached claims.

The invention claimed is:

1. A wiring circuit comprising:
   graphite wiring, wherein the graphite wiring comprises graphite,
   wherein the graphite wiring has a thickness of 3 nm or more and less than 300 nm,
   wherein the graphite has an electrical conductivity along a graphite film plane direction of 18000 S/cm or more, and
   wherein the graphite has a carrier mobility along the graphite film plane direction of 9500 cm$^2$/Vsec or more.

2. The wiring circuit according to claim 1, wherein the graphite wiring has a sectional area of 0.5 µm$^2$ or less.

3. The wiring circuit according to claim 1, wherein the graphite wiring has a line width of 1 µm or less.

4. A method for producing a wiring circuit, the method comprising steps
   (1), (2), (3), (4), (5), and (6) in an order of (1), (2), and (3), (4), (5), and (6)
   (1) a bonding step of bonding a graphite film with a substrate;
   (2) a plasma etching step of plasma etching the graphite film to form a graphite thin film; and
   (3) a wiring circuit formation step of etching the graphite thin film to form a wiring circuit;
   (4) a resist film formation step of forming a resist film on the graphite thin film;
   (5) a resist film circuit formation step; and
   (6) a resist film removal step.

5. The method for producing a wiring circuit according to claim 4, wherein the substrate is a silicon substrate.

6. The method for producing a wiring circuit according to claim 4, wherein the substrate is a silicon substrate with an oxide film formed on a surface of the substrate.

7. The method for producing a wiring circuit according to claim 4, wherein the plasma etching is oxygen plasma etching or air plasma etching.

8. The method for producing a wiring circuit according to claim 4, the method further comprising (7) a graphite film cleaning step, wherein the steps are conducted in an order of (7), (1), (2), (4), (5), (3), and (6).

9. The method for producing a wiring circuit according to claim 4, the method further comprising (8) a metal layer formation step of forming a metal layer on a surface of the substrate, wherein the steps are conducted in an order of (8), (1), (2), (4), (5), (3), and (6).

10. The method for producing a wiring circuit according to claim 9, wherein the metal layer is selected from the group consisting of nickel, phosphorus, a nickel alloy, a phosphorus alloy, gold, and silver solder.

11. The wiring circuit according to claim 1, wherein the carrier mobility along the graphite film plane direction is 9800 cm$^2$/Vsec or more.

12. The wiring circuit according to claim 2, wherein the carrier mobility along the graphite film plane direction is 9800 cm$^2$/Vsec or more.

13. The wiring circuit according to claim 3, wherein the carrier mobility along the graphite film plane direction is 9800 cm$^2$/Vsec or more.

* * * * *